United States Patent
Kojima et al.

(10) Patent No.: US 11,566,851 B2
(45) Date of Patent: Jan. 31, 2023

(54) VAPOR CHAMBER AND METHOD OF MANUFACTURING VAPOR CHAMBER

(71) Applicant: Murata Manufacturing Co., Ltd., Nagaokakyo (JP)

(72) Inventors: Keijiro Kojima, Nagaokakyo (JP); Takuo Wakaoka, Nagaokakyo (JP); Masaru Banju, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 125 days.

(21) Appl. No.: 16/861,262

(22) Filed: Apr. 29, 2020

(65) Prior Publication Data
US 2020/0256623 A1    Aug. 13, 2020

Related U.S. Application Data

(63) Continuation of application No. PCT/JP2019/031647, filed on Aug. 9, 2019.

(30) Foreign Application Priority Data

Nov. 16, 2018 (JP) ............................. JP2018-215500

(51) Int. Cl.
*F28D 15/04* (2006.01)
*B23P 15/26* (2006.01)

(52) U.S. Cl.
CPC .............. *F28D 15/04* (2013.01); *B23P 15/26* (2013.01); *B23P 2700/09* (2013.01)

(58) Field of Classification Search
CPC .... F28D 15/04; F28D 15/046; F28D 15/0233; B23P 15/26; B23P 2700/09; H05K 7/20336

(Continued)

(56) References Cited

U.S. PATENT DOCUMENTS 7,770,631 B2 * 8/2010 Wang .................. F28D 15/0233
                                              165/104.21
8,757,247 B2 * 6/2014 Yang .................... F28D 15/046
                                              165/104.21

(Continued)

FOREIGN PATENT DOCUMENTS

CN          205579718 U     9/2016
JP       2000230790 A  *   8/2000

(Continued)

OTHER PUBLICATIONS

International Search Report issued for PCT/JP2019/031647, dated Oct. 8, 2019.

(Continued)

*Primary Examiner* — Tho V Duong
(74) *Attorney, Agent, or Firm* — ArentFox Schiff LLP

(57) ABSTRACT

A vapor chamber that includes a housing having a first sheet and a second sheet that oppose each other and that are joined to each other in a peripheral region of the housing; a working liquid enclosed within the housing; and a wick structure on an inside surface of the first sheet or the second sheet. In the vapor chamber, the wick structure includes multiple protruding portions and a grid portion integral with the protruding portions. In addition, surfaces of the protruding portions and a surface of the grid portion opposite the inside surface of the first sheet or the second sheet are positioned on a same flat surface.

11 Claims, 4 Drawing Sheets

(58) Field of Classification Search
USPC .................................................. 165/104.26
See application file for complete search history.

(56) References Cited

U.S. PATENT DOCUMENTS

| | | | | |
|---|---|---|---|---|
| 8,857,502 | B2* | 10/2014 | Huang | ................ F28D 15/0233 |
| | | | | 165/104.26 |
| 9,664,458 | B2* | 5/2017 | Lin | ...................... F28D 15/046 |
| 10,544,994 | B2 | 1/2020 | Wakaoka et al. | |
| 11,131,508 | B2* | 9/2021 | Sheng | .................. F28D 15/046 |
| 2001/0004934 | A1* | 6/2001 | Yamamoto | ........... H01L 23/427 |
| | | | | 165/104.11 |
| 2006/0098411 | A1 | 5/2006 | Lee et al. | |
| 2007/0295486 | A1* | 12/2007 | Su | ........................ F28D 15/046 |
| | | | | 165/104.26 |
| 2008/0040925 | A1 | 2/2008 | Lee et al. | |
| 2017/0122672 | A1 | 5/2017 | Lin | |
| 2017/0138673 | A1 | 5/2017 | Aoki et al. | |
| 2018/0010861 | A1 | 1/2018 | Wakaoka et al. | |
| 2018/0058767 | A1 | 3/2018 | Machida et al. | |
| 2018/0164043 | A1* | 6/2018 | Kurashima | ........... F28D 15/046 |
| 2018/0320984 | A1 | 11/2018 | Lewis et al. | |
| 2019/0141855 | A1 | 5/2019 | Inagaki et al. | |
| 2020/0124352 | A1 | 4/2020 | Wakaoka et al. | |

FOREIGN PATENT DOCUMENTS

| | | |
|---|---|---|
| JP | 2006140435 A | 6/2006 |
| JP | 2011242061 A | 12/2011 |
| JP | 2011247462 A | 12/2011 |
| JP | 2015010765 A | 1/2015 |
| JP | 2018036012 A | 3/2018 |
| WO | 2016017471 A1 | 2/2016 |
| WO | 2016151916 A1 | 9/2016 |
| WO | 2018003957 A1 | 1/2018 |
| WO | 2018198354 A1 | 11/2018 |

OTHER PUBLICATIONS

Written Opinion of the International Searching Authority issued for PCT/JP2019/031647, dated Oct. 8, 2019.

* cited by examiner

VAPOR CHAMBER AND METHOD OF MANUFACTURING VAPOR CHAMBER

CROSS REFERENCE TO RELATED APPLICATIONS

The present application is a continuation of International application No. PCT/JP2019/031647, filed Aug. 9, 2019, which claims priority to Japanese Patent Application No. 2018-215500, filed Nov. 16, 2018, the entire contents of each of which are incorporated herein by reference.

FIELD OF THE INVENTION

The present invention relates to a vapor chamber and also to a method of manufacturing the vapor chamber.

BACKGROUND OF THE INVENTION

In recent years, an amount of heat generated by a microelectronics device has tended to increase due to high degree of integration and demand for high performance. Meanwhile, a product has become smaller in size, which causes heat generation density to increase. Dissipating heat has become an important issue. This situation is found especially in the field of mobile terminals, such as smartphones and tablet devices, and the thermal design thereof faces increasing difficulties. A graphite sheet or the like has been adopted as a heat dissipating member. However, the heat transport capacity of the graphite sheet is not large enough.

One of heat dissipating members having a high heat transport capacity is a vapor chamber, which is a sheet-type heat pipe. The vapor chamber as a whole exhibits an apparent thermal conductivity several times to several tens of times higher than that of a metal, such as copper or aluminum.

As an example of the heat dissipating member utilizing a vapor chamber, Patent Document 1 discloses a sheet-type member that is formed in such a manner that a wick structure, a nonwoven fabric, and a working liquid are enclosed in a sheet-like housing formed by joining metal sheets together.

Patent Document 1: International Publication No. 2016/151916

SUMMARY OF THE INVENTION

In the case of the vapor chamber being used as a heat dissipating member for a mobile terminal, a reduction in the thickness of the vapor chamber is especially demanded.

It is also demanded that the vapor chamber have a strength sufficient to prevent the wick portion from breaking due to bending or point loading.

As a preferred embodiment of the vapor chamber, Patent Document 1 describes a structure having a porous body disposed on a wick structure.

In this structure, the thickness of the vapor chamber may increase due to the porous body being disposed on the wick structure. In addition, the porous member may break under bending or point loading.

The present invention is made in such circumstances, and an object of the present invention is to provide a vapor chamber that has a reduced thickness and has a wick portion strong enough to resist bending or point loading, and another object is to provide a method of manufacturing such a vapor chamber.

The vapor chamber according to the present invention includes a housing having a first sheet and a second sheet that oppose each other and that are joined to each other in a peripheral region of the housing, a working liquid enclosed within the housing, and a wick structure on an inside surface of the first sheet or the second sheet. In the vapor chamber, the wick structure includes multiple protruding portions and a grid portion integral with the protruding portions. In addition, surfaces of the protruding portions and a surface of the grid portion opposite the inside surface of the first sheet or the second sheet are positioned on a same flat surface.

A method of manufacturing a vapor chamber according to the present invention includes performing patterning and metal plating on a substrate to form a grid portion having a plurality of openings; patterning a plating resist on the grid portion and over a first set of the plurality of openings of the grid portion in a first region, the plating resist having a height equal to or greater than a thickness of the grid portion and having second regions exposing a second set of the plurality of openings of the grid portion; forming protruding portions integrally with grid portion by metal plating within the second regions of the plating resist until the protruding portions have a thickness greater than the thickness of the grid portion; removing the plating resist; and removing the substrate so as to obtain a wick structure that includes the protruding portions and the grid portion integral with the protruding portions, and wherein top surfaces of the protruding portions and a top surface of the grid portion are positioned on a same flat surface.

According to the present invention, the vapor chamber that is suitable for thickness reduction and has the wick portion strong enough to resist bending or point loading can be provided, and a method of manufacturing the vapor chamber can be also provided.

DETAILED DESCRIPTION OF THE PREFERRED EMBODIMENTS

A vapor chamber according to the present invention and a method of manufacturing the vapor chamber will be described. The present invention, however, is not limited to the configurations described below. The present invention can be applied in appropriately modified forms insofar as the modified forms stay within the spirit of the present invention. Note that two or more of desirable configurations of the present invention described herein may be combined together, and such a combination is deemed within the scope of the present invention.

It should be understood that embodiments described below are merely examples and configurations described in different embodiments can be partially combined, or replaced, with each other.

The vapor chamber according to the present invention includes a housing having a first sheet and a second sheet that oppose each other and that are joined to each other in a peripheral region of the housing, a working liquid enclosed within the housing, and a wick structure on an inside surface of the first sheet or the second sheet. In the vapor chamber, the wick structure includes multiple protruding portions and a grid portion integral with the protruding portions. In addition, surfaces of the protruding portions and a surface of the grid portion opposite the inside surface of the first sheet or the second sheet are positioned on a same flat surface.

An exemplary configuration of the vapor chamber will be described with reference to FIG. 1.

Figure 1:
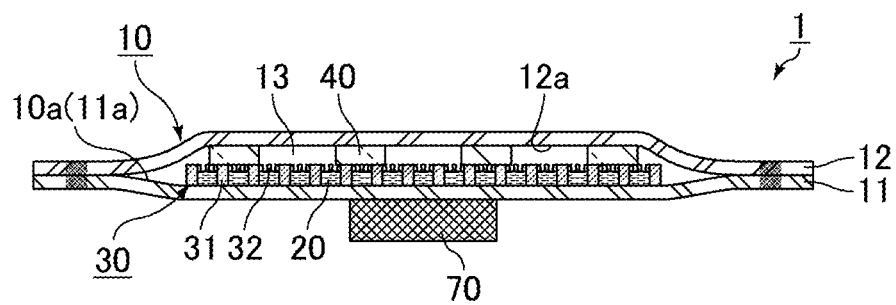
FIG. 1 is a cross-sectional view schematically illustrating an example of structure of a vapor chamber.

FIG. 1 is a cross-sectional view schematically illustrating an example of a structure of the vapor chamber.

A vapor chamber 1 illustrated in FIG. 1 includes a housing 10, a working liquid 20, a wick structure 30, and multiple pillars 40. The housing 10 is formed of a first sheet 11 and a second sheet 12 that oppose each other. The working liquid 20 is enclosed in the internal space of the housing 10. The wick structure 30 is disposed on an inside surface 11a of the first sheet 11, and the pillars 40 are disposed on an inside surface 12a of the second sheet 12. The housing 10 has a cavity 13 therein, and the first sheet 11 and the second sheet 12 are supported by the pillars 40 so as to maintain the cavity 13.

The first sheet 11 and the second sheet 12 are joined to, and sealed with, each other at peripheral regions thereof.

Inside the housing 10, the wick structure 30 is disposed on an inside surface 10a of the housing 10.

The wick structure 30 has multiple column-like protruding portions 31 and a grid portion 32 integral with the protruding portions 31. Details of the wick structure will be described later.

The working liquid 20 permeates in the wick structure 30 as a liquid phase. The working liquid 20 is also present in the cavity 13 as a vapor phase (water vapor in the case of the working liquid 20 being water).

A heat generating member 70 is disposed on the outside surface of the first sheet 11.

The working liquid 20 present in the wick structure 30 is evaporated at a position directly above the heat generating member 70 due to its heat, which thereby deprives the heat generating member 70 of heat.

The evaporated working liquid 20 moves toward the cavity 13 through openings of the grid portion 32 formed in the top surface of the wick structure 30.

The evaporated working liquid moves within the housing 10 and is condensed to the liquid phase near the peripheral region of the housing 10.

The working liquid 20 that has been returned to the liquid phase is absorbed by the wick structure 30 and is moved within the wick structure 30 toward the heat generating member 70 due to the capillary force of the wick structure 30. The heat generating member 70 is deprived of heat in this manner.

The heat generating member is cooled by the vapor chamber due to the working liquid being circulated within the housing as described above.

In the vapor chamber according to the present invention, the wick structure has multiple column-like protruding portions and a grid portion integral with the protruding portions.

Figure 2:
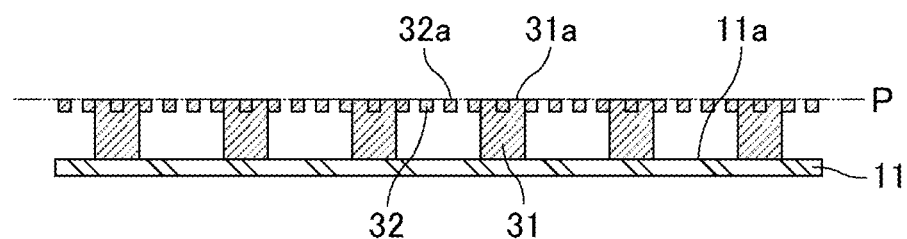
FIG. 2 is a cross-sectional view schematically illustrating an example of a wick structure constituted by multiple column-like protruding portions and a grid portion formed integrally with the protruding portions.
Figure 3A:
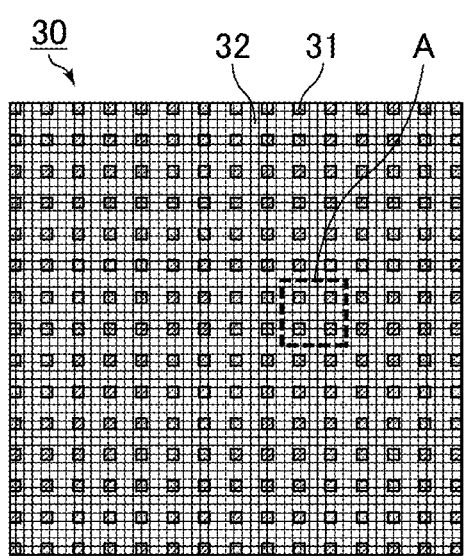
FIG. 3(a) is a top view schematically illustrating an example of the wick structure constituted by the multiple column-like protruding portions and the grid portion formed integrally with the protruding portions.

FIG. 2 is a cross-sectional view schematically illustrating an example of the wick structure having the multiple column-like protruding portions and the grid portion integral with the protruding portions. FIG. 3(a) is a top view schematically illustrating an example of the wick structure, and FIG. 3(b) is an enlarged view of a portion surrounded by the dashed line A in FIG. 3(a).

Figure 3B:
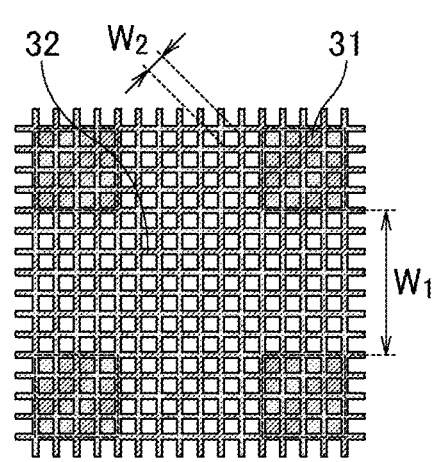
FIG. 3(b) is an enlarged view of a portion surrounded by a dashed line A in FIG. 3(a).

FIGS. 2, 3(a), and 3(b) schematically illustrate a positional relationship between the protruding portions and the grid portion. However, these figures do not reflect the reality of the actual dimensional relationship between the protruding portions and the grid portion.

As illustrated in FIG. 2, the protruding portions 31 are shaped like columns and disposed on the inside surface 11a of the first sheet 11. Multiple protruding portions 31 can retain the working liquid therebetween.

The grid portion 32 is formed at upper parts of the protruding portions 31, which are located opposite to the inside surface 11a of the first sheet 11. The grid portion 32 is integral with the protruding portions 31.

The top surfaces 31a of the protruding portions 31 and the top surface 32a of the grid portion 32 are positioned on the same flat surface.

In FIG. 2, the flat surface on which the top surfaces 31a of the protruding portions 31 and the top surface 32a of the grid portion 32 are positioned is indicated by the dash-dot-dot line P.

In the present specification, the expression "the top surfaces of the protruding portions and the top surface of the grid portion are on the same flat surface" or the expression "surfaces of the protruding portions and a surface of the grid portion opposite the inside surface of the first sheet or the second sheet are positioned on a same flat surface" means that when an arbitrary cross section of the wick structure is taken, a 30% or more areal portion of top surfaces of the protruding portions and a 30% or more areal portion of top surface of the grid portion have a height within a range of 5 μm of which the height of the wick structure in the arbitrary cross section is the median value (i.e., within a range of ±2.5 μm of the height of the wick structure in the cross section).

Accordingly, the grid portion is disposed at the same height as that of the protruding portions, and the top surfaces of the protruding portions and the top surface of the grid portion are positioned on the same flat surface. This enables the total thickness of the wick structure to be reduced compared with a case in which the grid portion is formed on top of the protruding portions (including a case of a known vapor chamber in which the grid portion is formed as a mesh, a porous member, or the like).

In other words, the vapor chamber can be made so as to have a reduced thickness.

In addition, having the grid portion integral with the protruding portions enables the grid portion to have a robust structure compared with a structure in which a porous member is placed on the wick structure. Accordingly, the strength of the wick structure can be increased against breakage due to bending or point loading.

In the vapor chamber according to the present invention, it is preferable that the protruding portions have a thickness greater than that of the grid portion.

Since the thickness of the protruding portions is greater than that of the grid portion, the protruding portions can be disposed so as to be in contact with an inside surface of the housing, and the grid portion can be disposed in an upper part of the wick structure (i.e., in the part that is opposite to the inside surface of the housing).

With this configuration, the working liquid can be retained among the protruding portions and can be evaporated through the grid portion, which enables the wick structure to function appropriately.

The thickness of the protruding portions is not specifically limited but may preferably be 1 µm to 100 µm, more preferably 5 µm to 50 µm, even more preferably 15 µm to 35 µm.

Increasing the thickness of the protruding portions can increase the amount of the working liquid retained therebetween. Decreasing the thickness of the protruding portions can expand the cavity in which the vapor of the working liquid moves.

Accordingly, the heat transport and thermal diffusion capacities of the vapor chamber can be adjusted by adjusting the thickness of the protruding portions.

The thickness of the grid portion is not specifically limited but may preferably be 1 µm to 50 µm, more preferably 2 µm to 20 µm, and even more preferably 5 µm to 10 µm.

Increasing the thickness of the grid portion can increase the strength of the wick structure against bending or point loading.

Decreasing the thickness of the grid portion can increase the amount of the working liquid retained.

FIGS. 3(a) and 3(b) illustrate shapes of top surfaces of the protruding portions 31 and the grid portion 32.

In FIGS. 3(a) and 3(b), each protruding portion 31 is shaped like a rectangular column and has a square top surface as viewed from above. However, the shape of the protruding portion 31 is not specifically limited. For example, it is preferable to shape the protruding portion 31 like a circular column, a rectangular column, a truncated cone, a truncated pyramid, or the like.

The grid portion is formed of ribs that extend longitudinally and laterally and of openings present between the ribs.

In FIGS. 3(a) and 3(b), the grid portion 32 is formed so as to have square openings. However, the shape of the grid portion 32 and the shape of each opening are not specifically limited. The openings may be shaped like circles, rectangles, or other polygons.

In the vapor chamber according to the present invention, it is preferable that the distance between adjacent protruding portions be greater than the width of each opening of the grid portion.

In FIG. 3(b), the distance between adjacent protruding portions 31 is denoted by $W_1$ using a double pointed arrow, and the opening width of the grid portion 32 is denoted by $W_2$ using another double pointed arrow. $W_1$ is greater than $W_2$.

Multiple protruding portions are typically arranged regularly. The distance between adjacent protruding portions is preferably taken as the distance between two protruding portions having the shortest distance.

The distance between the adjacent protruding portions is not specifically limited but may preferably be 1 µm to 500 µm, more preferably 5 µm to 300 µm, and even more preferably 15 µm to 200 µm. Decreasing the distance between the protruding portions can increase the capillary force. Increasing the distance between the protruding portions can increase the permeability in the vapor chamber. Increasing the permeability improves the heat transport capacity of the vapor chamber.

In FIG. 3(b), the width $W_2$ of the opening is taken as the diagonal length of the square in the case of the opening of the grid portion 32 being shaped like a square. In the case of the opening of the grid portion being another polygon, the width of the opening is taken as the longest diagonal that passes through the center of gravity of the polygon. In the case of each opening of the grid portion being a circle, the width of the opening is taken as the diameter of the circle.

The width of opening of the grid portion is preferably 0.01 µm to 10 µm.

When the width of opening of the grid portion is 10 µm or less, the capillary force can be increased.

Another example of structure of the vapor chamber will be described below.

Figure 4:
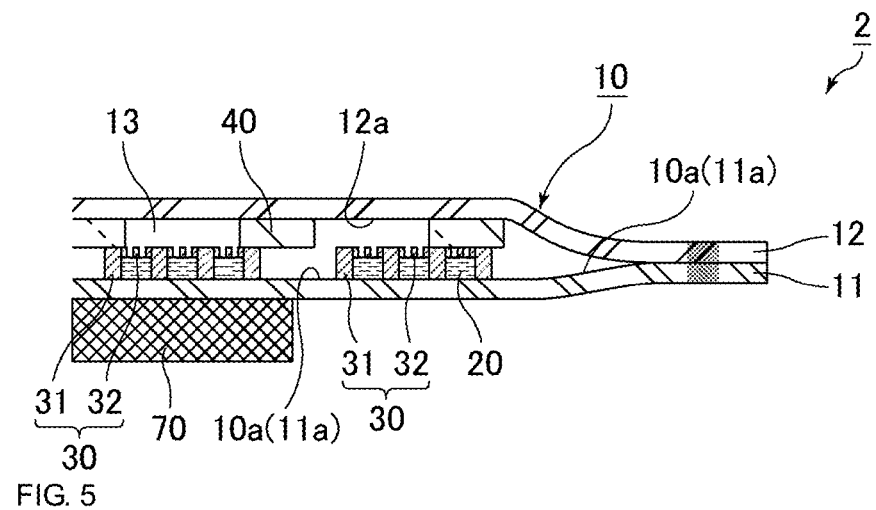
FIG. 4 is a cross-sectional view schematically illustrating another example of structure of the vapor chamber.

FIG. 4 is a cross-sectional view schematically illustrating another example of structure of the vapor chamber.

Figure 5:
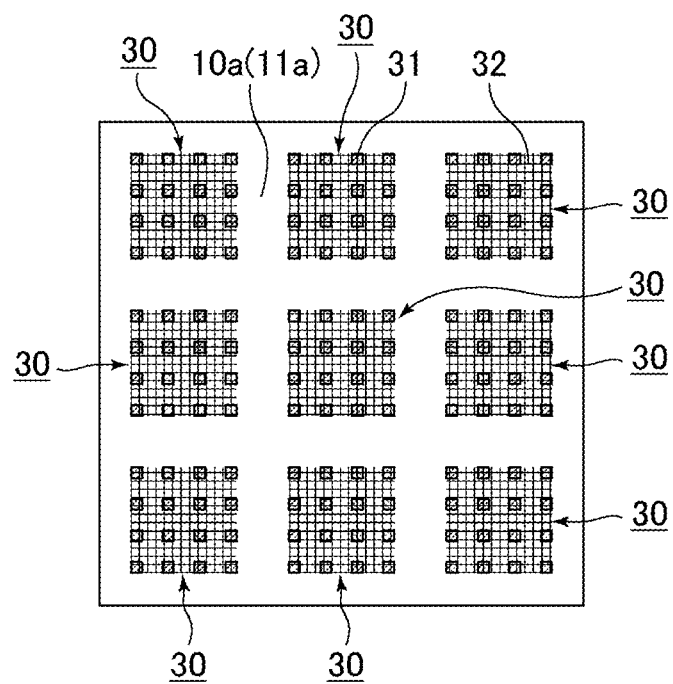
FIG. 5 is a top view schematically illustrating another example of a wick structure constituted by multiple column-like protruding portions and a grid portion formed integrally with the protruding portions.

FIG. 5 is a top view schematically illustrating another example of a wick structure having multiple column-like protruding portions and a grid portion integral with the protruding portions.

A vapor chamber 2 illustrated in FIG. 4 includes a no-wick region among wick structures 30.

FIG. 5 illustrates the vapor chamber 2 of FIG. 4 that includes the no-wick region among the wick structures 30.

The no-wick region among the wick structures 30 includes part of the inside surface 11a of the first sheet 11 and a space thereabove.

Providing the no-wick region increases the area through which the vapor-phase working liquid passes, which improves the thermal diffusion capacity of the vapor chamber.

The material of the protruding portions and the grid portion is not specifically limited insofar as the material has characteristics appropriate for the wick structure in terms of thermal conductivity, strength, and flexibility, for example. From a view point of a preferred method of manufacturing the wick structure, which will be described later, the material may preferably be a metal, for example, copper, nickel, aluminum, magnesium, titan, iron, or an alloy containing such metals as main ingredients. Of these metals, it is especially preferable to use copper.

The protruding portions and the grid portion are preferably made of the same metal. Bonding strength between the protruding portions and the grid portion increases by using the same metal. In addition, the thermal expansion coefficients of the protruding portions and the grid portion are made the same, which preferably prevents the integral structure of the protruding portions and the grid portion from breaking due to thermal expansion.

The shape of the housing is not specifically limited in the vapor chamber of the present invention.

For example, the shape of the housing in a plan view (the shape of housing of FIG. 1 as viewed from above) may be a polygon, such as a triangle or a rectangle, a circle, an oval, or a combination thereof.

In the vapor chamber of the present invention, the first sheet and the second sheet of the housing may be overlaid with respective ends being aligned with each other or slightly deviating from each other.

In the vapor chamber of the present invention, the materials of the first sheet and the second sheet are not specifically limited insofar as they have characteristics appropriate for the vapor chamber in terms of thermal conductivity, strength, and flexibility, for example. The materials of the first sheet and the second sheet may be preferably a metal, for example, copper, nickel, aluminum, magnesium, titan, iron, or an alloy containing such metals as main ingredients. The materials of the first sheet and the second sheet may be more preferably copper or a copper alloy.

In the vapor chamber of the present invention, the materials of the first sheet and the second sheets may be different from each other. For example, a material having a high strength may be used for the first sheet, which can thereby disperse stresses applied to the housing. Using different materials can provide one sheet with one function and the other sheet with an additional function. These functions are not specifically limited here, but may be, for example, a function of thermal conductivity or a function of a shield against electromagnetic waves.

In the vapor chamber of the present invention, the thicknesses of the first sheet and the second sheet are not specifically limited. However, in the case of the first sheet and the second sheet being too thin, the strength of the housing decreases, which leads to vulnerability to deformation. Accordingly, respective thicknesses of the first and the second sheets are preferably 20 µm or more, and more preferably 30 µm or more. On the other hand, in the case of the first sheet and the second sheet being too thick, it becomes difficult to reduce the entire thickness of the vapor chamber. Accordingly, respective thicknesses of the first and the second sheets are preferably 200 µm or less, more preferably 150 µm or less, and even more preferably 100 µm or less. The first sheet and the second sheet may have the same thickness or may have different thicknesses.

In the vapor chamber of the present invention, the first sheet may have a constant thickness or may have a thick portion and a thin portion. Similarly, the second sheet may have a constant thickness or may have a thick portion and a thin portion. The portion of the second sheet that is not in contact with the pillars may be recessed into the housing.

In the vapor chamber of the present invention, the working liquid is not specifically limited insofar as the working liquid is subjected to vapor-liquid phase change in the environment inside the housing. The working liquid may be, for example, water, an alcohol, or an alternative fluorocarbon. The working liquid is preferably an aqueous compound, and more preferably water.

In the vapor chamber according to the present invention, the pillars may be formed integrally with the second sheet. For example, the pillars may be formed by etching the inside surface of the second sheet.

In the vapor chamber of the present invention, the pillars support the first sheet and the second sheet from inside. Disposing the pillars inside the housing can suppress deformation of the housing in such a case that, for example, the inside of the housing is depressurized or an external pressure is applied to the housing. Note that the pillars may be in contact with the first sheet and the second sheet and support them directly. Alternatively, the pillars may support them with other members, such as a wick structure, interposed therebetween.

The shape of each pillar is not specifically limited but may be formed, for example, into a circular column, a rectangular column, a truncated cone, or a truncated pyramid.

The pattern of arranging the pillars is not specifically limited but may preferably be an equidistant arrangement, such as a grid-like pattern in which the pillars are disposed at equidistant grid points. The equidistant arrangement of the pillars provides the entire vapor chamber with a uniform strength.

The vapor chamber of the present invention is not limited to the embodiments described above but may be subjected to alterations and modifications in the configurations, manufacturing conditions, or the like, of the vapor chamber within the scope of the present invention.

The vapor chamber according to the present invention has the high heat transport and thermal diffusion capacities as described above. Accordingly, the vapor chamber can be preferably applied as a heat dissipation device.

In addition, the vapor chamber according to the present invention is advantageous for size reduction, especially for thickness reduction. Accordingly, the vapor chamber can be suitably used in devices, such as electronic devices, of which the size reduction is demanded.

The method of manufacturing the vapor chamber of the present invention is not specifically limited insofar as the above-described configurations can be obtained. The following is an exemplary method of manufacturing the vapor chamber according to the present invention, which includes a step of forming a wick structure by using a method described below.

A method of manufacturing a vapor chamber according to the present invention includes performing patterning and metal plating on a substrate to form a grid portion having a plurality of openings; patterning a plating resist on the grid portion and over a first set of the plurality of openings of the grid portion in a first region, the plating resist having a height equal to or greater than a thickness of the grid portion and having second regions exposing a second set of the plurality of openings of the grid portion; forming protruding portions integrally with grid portion by metal plating within the second regions of the plating resist until the protruding portions have a thickness greater than the thickness of the grid portion; removing the plating resist; and removing the substrate so as to obtain a wick structure that includes the protruding portions and the grid portion integral with the protruding portions, and wherein top surfaces of the protruding portions and a top surface of the grid portion are positioned on a same flat surface.

An example of manufacturing process of a wick structure will be described with reference to the drawings.

FIGS. 6(a), 6(b), 6(c), 6(d) and FIGS. 7(a), 7(b), 7(c), and 7(d) are cross-sectional views schematically illustrating an example of the manufacturing process of the wick structure.

Firstly, a step of forming a grid portion having openings (i.e., a grid portion forming step) is carried out by performing patterning and metal plating on a substrate.

Figure 6A:
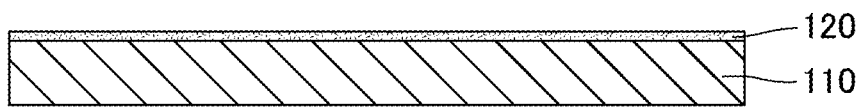
FIG. 6(a), FIG. 6(b), FIG. 6(c), and FIG. 6(d) are cross-sectional views schematically illustrating an example of manufacturing process of a wick structure.

FIG. 6(a) illustrates a substrate 110 having a seed layer 120.

The seed layer 120 serves as a base layer for metal plating. In the case of the substrate 110 being made of such a material that metal plating cannot be performed directly thereon, it is necessary to form the seed layer 120 on the substrate 110.

A material, such as a metal or a resin, can be used for the substrate.

Since the seed layer is the base layer for metal plating, it is preferable to use nickel, chromium, or the like, for the seed layer.

Figure 6B:
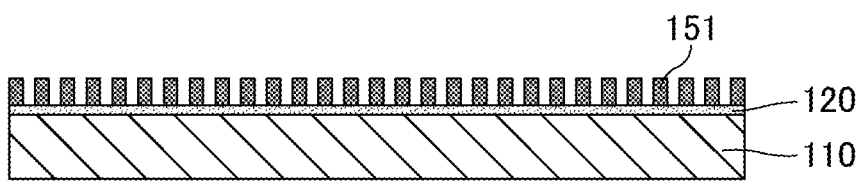

Next, as illustrated in FIG. 6(b), a plating resist 151 for making the grid portion is formed on the seed layer 120 by using a method, such as printing or exposure and development.

The plating resist 151 for making the grid portion is formed at positions at which openings of the grid portion are to be formed.

Figure 6C:
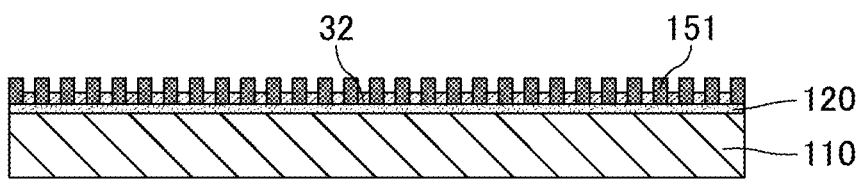
Figure 6D:
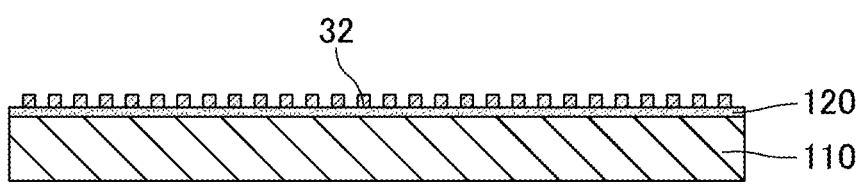

Subsequently, as illustrated in FIG. 6(c), metal plating is performed. After the plating resist 151 for making the grid portion is removed, a patterned grid portion 32 is obtained on the seed layer 120 as illustrated in FIG. 6(d).

Portions at which the plating resist 151 for making the grid portion occupies become the openings of the grid portion 32.

Thus, the grid portion forming step is carried out.

Next, a step of patterning a plating resist is carried out (i.e., a forming step of a plating resist for making the protruding portions). In this step, the plating resist is patterned in such a manner that the plating resist is formed on the grid portion and over openings of the grid portion in a region other than regions in which protruding portions are to be formed and the plating resist has a height equal to or greater than the thickness of the grid portion.

Figure 7A:
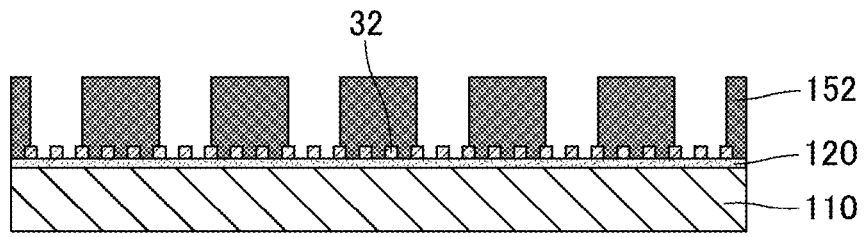
FIG. 7(a), FIG. 7(b), FIG. 7(c), and FIG. 7(d) are cross-sectional views schematically illustrating an example of manufacturing process of the wick structure.

FIG. 7(a) illustrates a plating resist 152 for making the protruding portions.

The plating resist 152 for making the protruding portions is formed on the grid portion 32 and over openings of the grid portion 32 (i.e., on the grid portion 32 and the seed layer 120 exposed through the openings) by using a method, such as printing or exposure and development.

The plating resist 152 for making the protruding portions is formed to a height equal to or greater than the thickness of the grid portion 32 in a first region other than second regions in which protruding portions are to be formed.

Next, a step of forming column-like protruding portions (i.e., a protruding portion forming step) is carried out. In this step, the column-like protruding portions are formed integrally with the grid portion by metal plating to a thickness greater than the thickness of the grid portion, and the plating resist is subsequently removed.

Figure 7B:
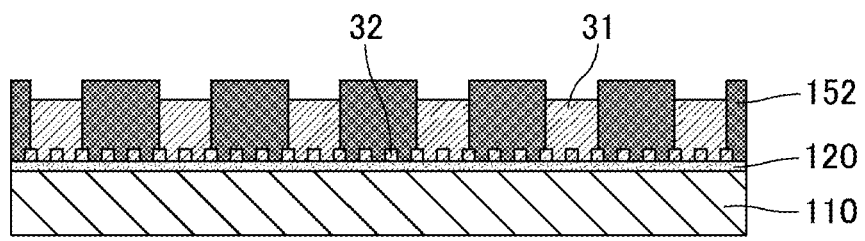
Figure 7C:
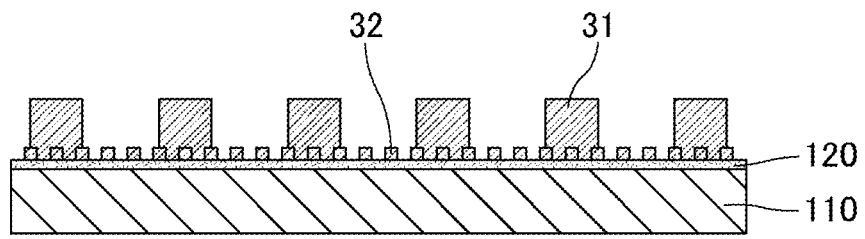

As illustrated in FIG. 7(b), metal plating is carried out in a region where the plating resist 152 for making the protruding portions is not present. After the plating resist 152 for making the protruding portions is removed, the protruding portions 31 are formed on the grid portion 32 and in some openings of the grid portion 32 (i.e., on the seed layer 120) as illustrated in FIG. 7(c).

The protruding portions 31 are made of a plated metal formed over the plated metal of the grid portion 32. Accordingly, the protruding portions 31 and the grid portion 32 are formed as an integral structure due to respective plated metals being bonded firmly.

Put another way, respective parts of the grid portion 32 are buried in the protruding portions 31.

The plating resist 152 for making the protruding portions is formed to a height greater than the thickness of the grid portion 32. Accordingly, the column-like protruding portions 31 that is thicker than the grid portion 32 can be formed by performing metal plating halfway to the height of the plating resist 152 for making the protruding portions.

Next, a step of removing the substrate (i.e., a substrate removing step) is carried out.

In the case of the seed layer formed on the substrate, the seed layer is also removed.

The seed layer can be removed by etching. The etching for the seed layer can also remove the substrate.

By removing the seed layer 120 and the substrate 110, the wick structure 30 constituted by the multiple column-like protruding portions 31 and the grid portion 32 formed integrally with the protruding portions 31 is obtained.

The wick structure 30 is subsequently cut out by cutting along the cutting-plane lines (i.e., along the dash-dot lines C in FIG. 7(d)), which indicates the outer periphery of the wick structure.

Figure 7D:
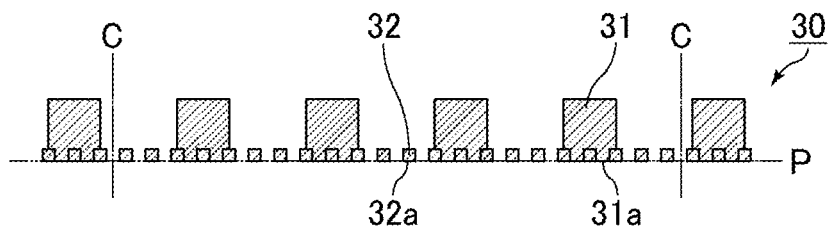

In the wick structure 30 obtained, the top surfaces 31a of the protruding portions 31 and the top surface 32a of the grid portion 32 are positioned on the same flat surface (i.e., on the surface indicated by the dash-dot-dot line P in FIG. 7(d)) that is obtained by removing the substrate 110 (and the seed layer 120).

Note that in FIG. 7(d), the top surfaces 31a of the protruding portions 31 and the top surface 32a of the grid portion 32 are illustrated so as to face downward.

Thus, the wick structure is obtained. The wick structure includes the multiple column-like protruding portions and the grid portion formed integrally with the protruding portions, and the top surfaces of the protruding portions and the top surface of the grid portion are positioned on the same flat surface obtained by removing the substrate.

The vapor chamber can be manufactured by using the wick structure obtained in the above-described manner.

For example, the vapor chamber can be obtained by overlaying and joining together the first sheet having the wick structure fixed thereto and the second sheet having the pillars disposed thereon while leaving an opening portion for pouring the working liquid. The opening portion is sealed after the working liquid is poured.

The fixation of the wick structure to the first sheet is carried out by using a method, such as laser welding, resistance welding, diffusion bonding, soldering, TIG arc welding (tungsten inert-gas arc welding), ultrasonic bonding, or using an adhesive. Of these methods, laser welding, resistance welding, or soldering may be preferably used.

The fixation of the wick structure to the first sheet can be carried out by using the above fixation method while the wick structure is placed on the first sheet in such a manner that the surface of the wick structure having the protruding portions (i.e., the surface opposite to the surface having the grid portion) faces the first sheet.

The method of joining the first sheet and the second sheet together is not specifically limited but may utilize, for example, laser welding, resistance welding, diffusion bonding, soldering, TIG arc welding (tungsten inert-gas arc welding), ultrasonic bonding, or plastic molding. Of these methods, laser welding, resistance welding, or soldering may be preferably used.

REFERENCE SIGNS LIST 1, 2 vapor chamber
10 housing
10a inside surface of housing
11 first sheet
11a inside surface of first sheet
12 second sheet
12a inside surface of second sheet
13 cavity
20 working liquid
30 wick structure
31 protruding portions
31a top surface of protruding portion
32 grid portion
32a top surface of grid portion
40 pillar
70 heat generating member
110 substrate
120 seed layer
151 plating resist for making grid portion
152 plating resist for making protruding portions

The invention claimed is:

1. A vapor chamber comprising:
    a housing having a first sheet and a second sheet that oppose each other and that are joined to each other in a peripheral region of the housing;
    a working liquid enclosed within the housing; and
    a wick structure on an inside surface of one of the first sheet or the second sheet, wherein
    the wick structure includes multiple protruding portions and a grid portion integral with the protruding portions, the multiple protruding portions being arranged in an array within an area defined by a perimeter of the wick structure,
    surfaces of the protruding portions and a surface of the grid portion that are opposite and most remote from the inside surface of the one of the first sheet or the second sheet that the wick structure is on are on a same flat surface, and the same flat surface is spaced from the inside surface of both the first sheet and the second sheet, and
    a width of any one of the protruding portions is larger than a width of any one of the openings in the grid portion.

2. The vapor chamber according to claim 1, wherein a distance between adjacent protruding portions of the multiple protruding portions is greater than a width of any one of the openings of the grid portion, and thicknesses of the protruding portions are greater than a thickness of the grid portion.

3. The vapor chamber according to claim 2, wherein the multiple protruding portions and the grid portion comprise a same metal.

4. The vapor chamber according to claim 1, wherein the multiple protruding portions and the grid portion comprise a same metal.

5. The vapor chamber according to claim 1, wherein multiple protruding portions are column shaped.

6. The vapor chamber according to claim 1, thicknesses of the protruding portions are greater than a thickness of the grid portion.

7. The vapor chamber according to claim 1, wherein a thickness of the protruding portions is 1 µm to 100 µm, and a thickness of the grid portion is 1 µm to 50 µm.

8. The vapor chamber according to claim 1, wherein a distance between adjacent protruding portions of the multiple protruding portions is greater than a width of any one of the openings of the grid portion.

9. The vapor chamber according to claim 8, wherein the distance between the adjacent protruding portions of the multiple protruding portions is 1 µm to 500 µm, and the width of the any one of the openings of the grid portion is 0.01 µm to 10 µm.

10. The vapor chamber according to claim 1, wherein the wick structure is on the inside surface of the first sheet, and the vapor chamber further comprises multiple pillars on an inside surface of the second sheet.

11. The vapor chamber according to claim 1, wherein the vapor chamber includes a plurality of the wick structures on the inside surface of the one of the first sheet or the second sheet, the plurality of the wick structures being spaced apart from each other.

* * * * *